United States Patent
Patra et al.

(10) Patent No.: US 9,881,117 B1
(45) Date of Patent: Jan. 30, 2018

(54) PREDICTIVE CIRCUIT DESIGN FOR INTEGRATED CIRCUITS

(71) Applicant: Xilinx, Inc., San Jose, CA (US)

(72) Inventors: Anindita Patra, San Jose, CA (US);
Nabeel Shirazi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/204,883

(22) Filed: Jul. 7, 2016

(51) Int. Cl.
*G06F 17/50* (2006.01)

(52) U.S. Cl.
CPC ...... *G06F 17/5072* (2013.01); *G06F 17/5068* (2013.01)

(58) Field of Classification Search
CPC ............ G06F 17/5045; G06F 17/5068; G06F 17/505; G06F 2217/66
USPC .......................... 716/100, 101, 104, 110, 119
See application file for complete search history.

(56) References Cited

U.S. PATENT DOCUMENTS

| | | | | |
|---|---|---|---|---|
| 6,687,710 | B1 * | 2/2004 | Dey .................... | G06F 17/5045 705/36 R |
| 6,961,913 | B1 * | 11/2005 | Okazaki et al. .... | G06F 17/5045 716/102 |
| 8,156,453 | B1 * | 4/2012 | Nozarian et al. ... | G06F 17/5045 705/500 |
| 8,522,180 | B1 * | 8/2013 | Ng et al. ............. | G06F 17/5045 716/110 |
| 8,863,052 | B1 * | 10/2014 | Dhuria et al. ...... | G06F 17/5036 716/108 |
| 9,116,689 | B2 * | 8/2015 | Arai .......................... | G06F 1/32 |

OTHER PUBLICATIONS

Xilinx, Inc., Vivado Design Suite User Guide, Designing IP Subsystems Using IP Integrator, User Guide, UG994 (v2013.3), Oct. 2, 2013, pp. 1-102, San Jose, USA.

* cited by examiner

*Primary Examiner* — Sun Lin
(74) *Attorney, Agent, or Firm* — Kevin T. Cuenot

(57) ABSTRACT

A method for creating a circuit design for an integrated circuit includes, responsive to a request to modify a current circuit design, determining, using a processor, a first core used in the current circuit design and predicting, using the processor, a second core not yet included in the current circuit design as a candidate core for inclusion in the current circuit design. The second core is determined based upon usage of the second core and the first core, in combination, in a plurality of example circuit designs.

20 Claims, 7 Drawing Sheets

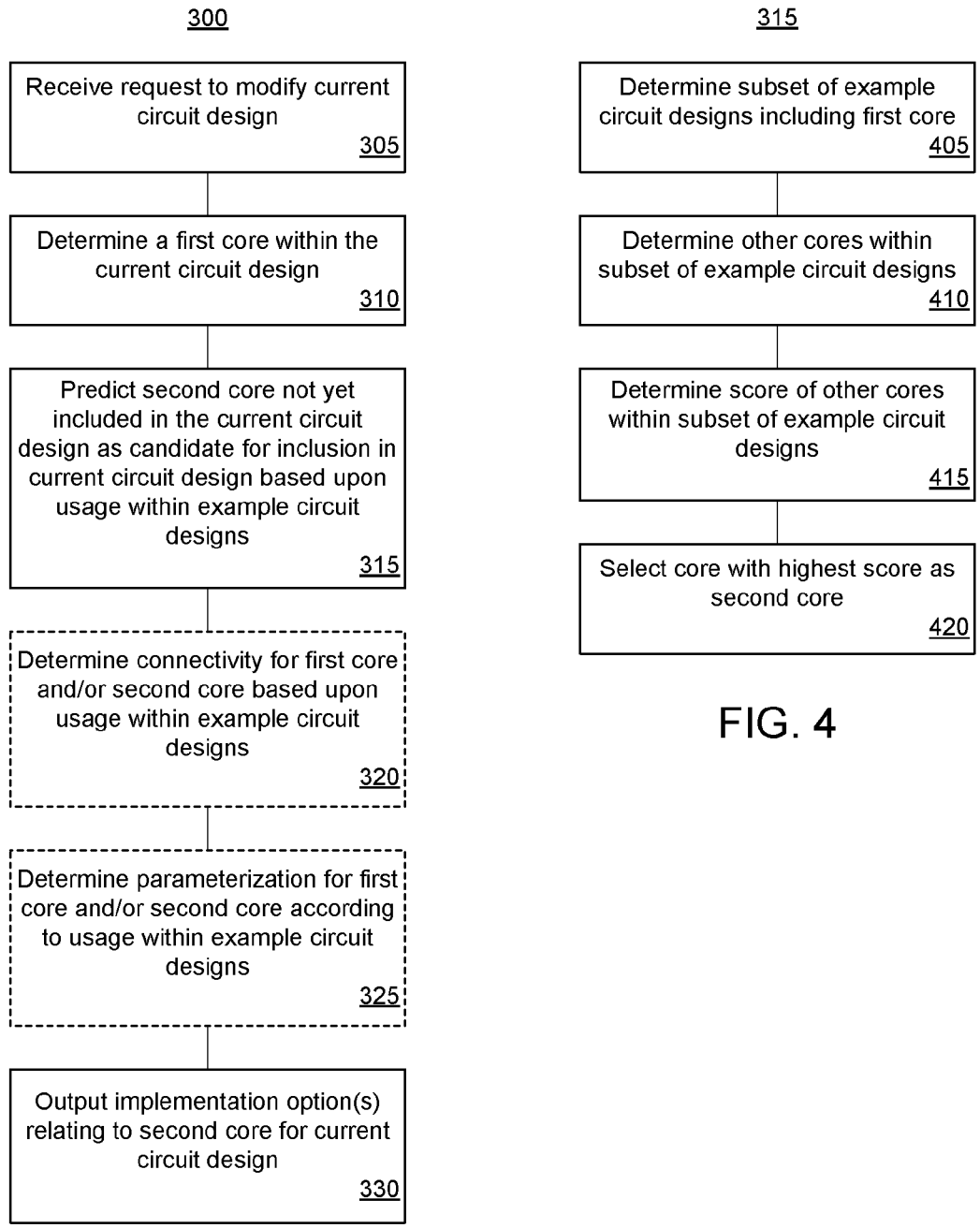

─ 1100

Console View

| | |
|---|---|
| 1102 | INFO: [IP_Flow 19-1704] No user IP repositories specified |
| 1104 | INFO: [IP_Flow 19-2313] Loaded Vivado IP repository '/build/xfndry/.... |
| 1106 | set_property board_part xilinx.com:kc705:part0:1.3 [current_project] |
| 1108 | Create_bd_design "design_1" |
| 1110 | Wrote : </wrk/xsjhdnobkup2/username/predictive_assistance/project... |
| 1112 | update_compile_order -fileset source_1 |
| 1114 | startgroup |
| 1116 | create_bd_cell -type ip -vlnv xilinx.com:ip:microblaze:9.6 microblaze_0 |
| 1118 | endgroup |

Command Line create_bd_cell -type ip-vlnv xilinx.com:ip

PREDICTIVE CIRCUIT DESIGN FOR INTEGRATED CIRCUITS

FIELD OF THE INVENTION

This disclosure relates to integrated circuits (ICs) and, more particularly, to predictive circuit design for ICs.

BACKGROUND

Modern electronic design automation tools allow designers to build electronic systems, e.g., circuits, by adding graphical blocks into a computer-based, graphical, design environment. Each graphical block represents some portion of circuitry such as a core. Having added one or more graphical blocks to the design environment, the designer may manually assign values to parameters of the graphical blocks, specify connections between the graphical blocks, include additional interface circuitry, and so forth.

For example, once a graphical block is added to a circuit design in the graphical design environment, the designer may manually enable particular interfaces, pins, and so forth on the graphical block thereby making such features available for use within the electronic system. The designer may then specify connectivity among the graphical blocks of the electronic system by drawing connections between the enabled elements of the various graphical blocks.

SUMMARY

A method includes, responsive to a request to modify a current circuit design, determining, using a processor, a first core used in the current circuit design. The method includes predicting, using the processor, a second core not yet included in the current circuit design as a candidate core for inclusion in the current circuit design. The second core is determined based upon usage of the second core and the first core, in combination, in a plurality of example circuit designs.

A system includes a processor programmed to initiate executable operations. The executable operations include, responsive to a request to modify a current circuit design, determining a first core used in the current circuit design. The executable operations further include predicting a second core not yet included in the current circuit design as a candidate core for inclusion in the current circuit design. The second core is determined based upon usage of the second core and the first core, in combination, in a plurality of example circuit designs.

A computer program product comprising a computer readable storage medium having program code stored thereon. The program code is executable by a processor to perform operations. The operations include, responsive to a request to modify a current circuit design, determining, using the processor, a first core used in the current circuit design. The operations further include predicting, using the processor, a second core not yet included in the current circuit design as a candidate core for inclusion in the current circuit design. The second core is determined based upon usage of the second core and the first core, in combination, in a plurality of example circuit designs.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 3 is a flow chart illustrating an example of a method of predictive circuit design.

FIG. 4 is a flow chart illustrating an example implementation of block 315 of FIG. 3.

FIGS. 6-11 are diagrams illustrating example operations performed by a system for predictive circuit design.

DETAILED DESCRIPTION OF THE DRAWINGS

Figure 1:
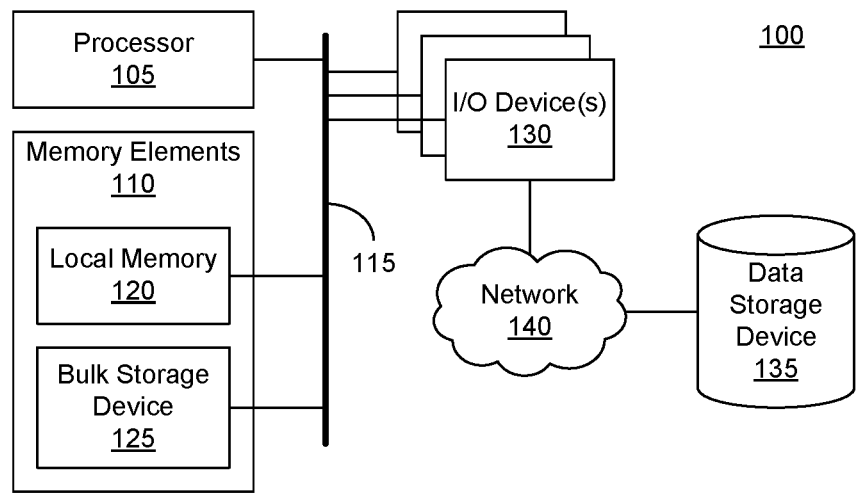
FIG. 1 is a diagram illustrating an example of a system for predictive circuit design.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to predictive circuit design for ICs. In accordance with the inventive arrangements described within this disclosure, predictive assistance can be provided during the circuit design process. As such, the particular circuit structures to be included in a current circuit design may be predicted in an automated manner and provided as implementation options.

In one aspect, a system may analyze a current circuit design under development (hereafter a "current circuit design") to identify one or more particular circuit structures included therein. The system may determine example circuit designs that include similar or same circuit structures as the current circuit design. Based upon other circuit structures detected within the example circuit designs that also include the circuit structure(s) of the current circuit design, the system can predict likely implementation options for the current circuit design. The term "implementation option," as defined herein, means a proposed modification to a current circuit design, where the circuit design is a programmatic description of an electronic system. A circuit design may be stored as a data structure stored on a computer readable storage medium. Examples of implementation options may include, but are not limited to, additional, i.e., predicted, circuit structures to include within the current circuit design, predicted connectivity of the existing circuit structure(s) and/or the predicted circuit structure(s), predicted parameterization(s) for the existing circuit structure(s) and/or the predicted circuit structure(s), and so forth.

Conventional circuit design tools provide varying levels of automation. For example, some circuit design tools may make a connection between two circuit structures responsive to a user request. This type of automation, however, presumes that the circuit structures being connected have already been implemented added to the current circuit design by the designer. The designer, therefore, must know which circuit structures to include in the current circuit design and have an understanding of the interoperability of the circuit structures.

In one aspect, the inventive arrangements may be implemented as a method or process for predictive circuit design performed by a data processing system. In another aspect, the inventive arrangements may be implemented as system configured to perform predictive circuit design. For example, a system may include a processor configured to initiate and/or perform executable operations relating to predictive circuit design. In still another aspect, the inventive arrangements may be implemented as a non-transitory, computer-readable storage medium storing program code that, when executed, causes a processor and/or a system to perform and/or initiate a method or process of predictive circuit design.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a diagram illustrating an example of a system 100 for predictive circuit design. As pictured, system 100 includes at least one processor, e.g., a central processing unit (CPU), 105 coupled to memory elements 110 through a system bus 115 or other suitable circuitry. System 100 stores computer readable instructions (also referred to as "program code") within memory elements 110. Memory elements 110 may be considered an example of computer readable storage media. Processor 105 executes the program code accessed from memory elements 110 via system bus 115.

Memory elements 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), a solid state drive (SSD), or other persistent data storage device. System 100 may also include one or more cache memories (not shown) that provide temporary storage of at least some program code in order to reduce the number of times program code must be retrieved from bulk storage device 125 during execution.

System 100 may include one or more input/output (I/O) devices 130 coupled to system bus 115. Examples of I/O devices 130 may include, but are not limited to, a keyboard, a display device, a pointing device, one or more network adapters and so forth. I/O devices 130 may be coupled to system bus 115 either directly or through intervening I/O controllers. In some cases, one or more of I/O devices 130 may be combined as in the case where a touchscreen is used as a display device. In that case, the display device may also implement a keyboard and a pointing device.

A network adapter I/O device may be used to couple system 100 to other systems, computer systems, remote printers, and/or remote storage devices (e.g., network attached storage devices) such as data storage device 135 through intervening private or public networks, e.g., network 140. Modems, cable modems, Ethernet cards, wireless transceivers, and/or wireless radios are examples of different types of network adapters that may be used with system 100. Depending upon the particular implementation of system 100, the specific type of network adapter, or network adapters as the case may be, will vary.

In one aspect, system 100 may be a computer or other device that is suitable for storing and/or executing program code. System 100 may represent any of a variety of computer systems, data processing systems, and/or devices that include a processor and memory and that are capable of performing the operations described within this disclosure. In some cases, system 100 may include fewer components or more components than described. System 100 may be implemented as a single system as shown or as a plurality of networked or interconnected systems each having an architecture the same as, or similar to, that of system 100.

Accordingly, system 100 may include an operating system and one or more applications that are executed by processor 105. For example, system 100 may execute an electronic design automation (EDA) application. The operating system and any applications, being implemented in the form of executable program code and being executed by system 100, may be considered an integrated part of system 100. The operating system, applications, and any data items used, generated, and/or operated upon by system 100 are functional data structures that impart functionality when utilized by system 100.

As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Figure 2:
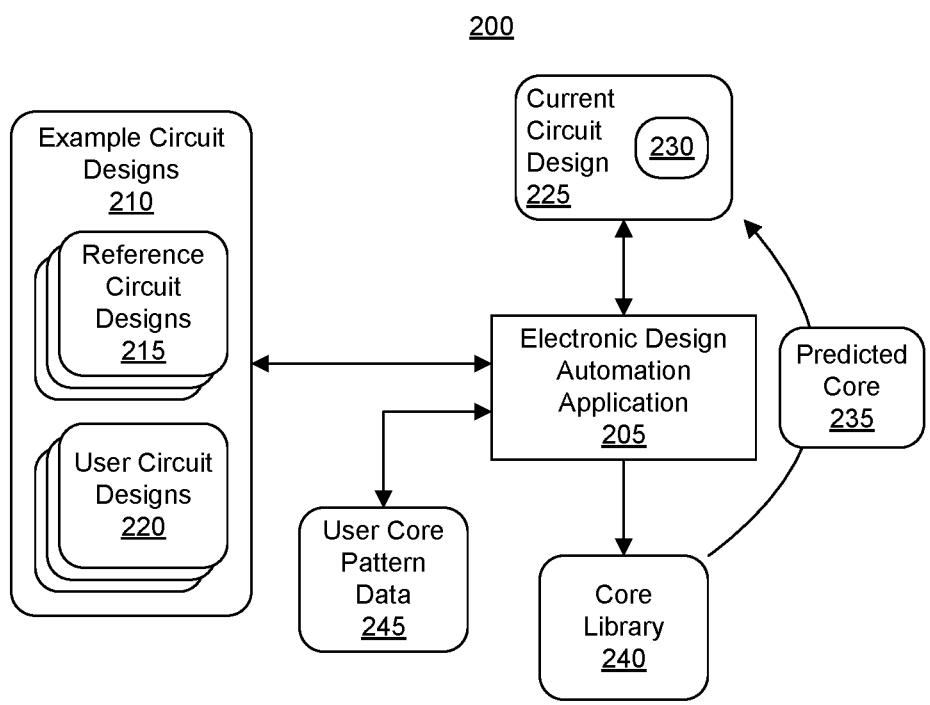
FIG. 2 is a diagram illustrating an example architecture for the system of FIG. 1.

FIG. 2 is a diagram illustrating an example architecture 200. Architecture 200 may be implemented by system 100 of FIG. 1. As pictured, architecture 200 includes an EDA application 205 that may be executed by processor 105. It should be appreciated, that for purposes of this disclosure, reference to operations performed by an application, e.g., EDA application 205, means a processor, e.g., processor 105, executing the application. Example circuit designs 210, current circuit design 225, core library 240, and/or user core pattern data 245 may be stored as files, e.g., data structures, in memory elements 110 and/or within data storage device 135 of system 100.

In one embodiment, example circuit designs 210 include one or more reference circuit designs 215. Reference circuit designs 215 may be circuit designs made available from one or more third parties. Reference circuit designs 215 may be included in a library of circuit designs available for use with system 100. Reference circuit designs 215 are not associated with any particular user.

In another embodiment, example circuit designs 210 include one or more user circuit designs 220. User circuit designs 220 are circuit designs created by or modified by a particular user. For example, a user circuit design 220 may be a reference circuit design 215 that has been modified and/or changed by a user. User circuit designs 220 may include prior circuit designs created and/or modified by the user. For example, user circuit designs 220 may be historical circuit designs created and/or modified by the user.

EDA application 205 may analyze current circuit design 225. Current circuit design 225 may be a circuit design that is currently under development using the EDA application. EDA application 205 may analyze current circuit design 225 to predict one or more implementation options for current circuit design 225. For example, EDA application 205 may analyze current circuit design 225 to predict circuit structures that may be included within current circuit design 225. In one arrangement, current circuit design 225 is a circuit design associated with, or created by, the same user that created and/or modified user circuit designs 220. EDA application 205 may determine the particular circuit structure, or structures, already included within current circuit design 225.

In one embodiment, circuit structure is expressed as one or more cores. Accordingly, EDA application 205 may predict one or more cores not yet included in current circuit 225 design as candidate core(s) for inclusion in current circuit design 225. For purposes of illustration, EDA application 205 determines that current circuit design 225 includes circuit structure such as core 230.

As defined herein, the term "core" means a pre-designed and reusable unit of logic, of a cell, or of a chip (e.g., semiconductor) layout design in the field of electronic circuit design. A core, sometimes referred to as an "Intellectual Property" or "IP" or "IP block" is expressed programmatically as a data structure describing hardware that performs a particular function. A core may be expressed using hardware description language file(s), as a netlist, as a bitstream that programs a programmable IC, or the like. A core may be used as a building block within an application-specific IC chip design or within a programmable IC circuit design, e.g., an FPGA circuit design.

A core further may include additional resources such as source code, high level programming language models, schematics, documentation, and the like. Examples of different varieties of cores include, but are not limited to, digital signal processing (DSP) functions, memories, storage elements, math functions, etc. Some cores include an optimally floorplanned layout targeted to a specific family of ICs. Cores also may be parameterizable in that a user may enter parameters to activate or change certain functionality of a core.

EDA application 205 analyzes example circuit designs 210 to determine which of example circuit designs 210 include core 230. EDA application 205 further may determine, of example circuit designs 210 that include core 230, which other cores are used with core 230. EDA application 205 may score the other cores.

For example, EDA application 205 may determine other cores used with core 230 in example circuit designs 210. EDA application 205 further may determine a score such as the frequency of use for each other core used within example circuit designs 210 also including core 230. Frequency of use may be determined across example circuit designs 210. For example, EDA application 205 may determine the number of circuit designs of total number of example circuit designs 210 where a particular core is included or used in combination with core 230 as the frequency of use. EDA application 205 may rank the other cores according to their scores. EDA application 205 may select the core with the highest score, e.g., the highest frequency of use with core 230, as predicted core 235.

In one embodiment, EDA application 205 is configured to utilize only reference circuit designs 215 when predicting a core to be included in current circuit design 225. In another embodiment, EDA application 205 is configured to utilize only user circuit designs 220, e.g., the user's circuit design history, when predicting a core to be included in current circuit design 225. In still another embodiment, EDA application 205 may utilize both reference circuit designs 215 and user circuit designs 220 when predicting a core to be included in current circuit design 225.

In the case where EDA application 205 uses both reference circuit designs 215 and user circuit designs 220, each category of example circuit design may be given the same weight (importance) in predicting cores to be included in current circuit design 225. In another example, the importance of reference circuit designs 215 and user circuit designs 220 may be different by using different weighting.

In illustration, EDA application 205 may determine other cores used with core 230 within reference circuit designs 215 and a frequency of use for one or more or each of the other cores. EDA application 205 may apply a first weight to the frequencies of use for the cores determined from reference designs 215 to generate weighted frequencies of use, e.g., scores, for each of the other cores. The first weight is specific to reference circuit designs 215. EDA application 205 may also determine cores used with core 230 within user circuit designs 220 and a frequency of use for one or more or each of the other cores. EDA application 205 may apply a second weight to the frequencies of use for the cores determined from user circuit designs 220 to generate weighted frequencies of use, e.g., a score, for the cores. The second weight is specific to user circuit designs 220.

The first and second weight may be the same or different. In this regard, depending upon the size of the first and second weights, cores from reference circuit designs 215 may be favored over cores from user circuit designs 220 or vice versa depending upon the value of the weight that is applied. In cases where a core is detected within reference circuit designs 215 and also in user circuit designs 220, the core may have two scores that may be summed to arrive at a final score used to select the predicted core. EDA application 205 may select the core, or cores, with the highest score as predicted core 235.

As pictured, EDA application 205 may obtain predicted core 235 from a core library 240. Core library 240 may include a listing or example of each of the various other types of cores for which example circuit designs 210 are evaluated as described above. That is, EDA application 205 may be configured to detect instances of any core from core library 240 as "another" core when searching for other cores within example circuit designs 210 used in combination with core 230.

In one aspect, EDA application 205 may query the user whether to include predicted core 235 within current circuit design 225 and include predicted core 235 within current circuit design 225 only responsive to approval received in response to the query. In another aspect, EDA application 205 may include predicted core 235 within current circuit design 225 automatically responsive to EDA application 205 predicting a core as predicted core 235.

In one or more other embodiments, EDA application 205 may predict parameterizations and/or connectivity of cores as one or more implementation options. For example, EDA application 205 may predict a parameterization of predicted core 235 and/or of core 230. EDA application 205 may determine the most frequently occurring parameterization(s) of core 230 and/or predicted core 235 from example circuit designs 210. The determined parameterizations may be provided as predicted parameterizations for core 230, for predicted core 235, or for both as implementation option(s).

Similarly, EDA application 205 may determine connectivity of core 230 and/or predicted core 235 as one or more implementation options. EDA application 205 may determine the most frequent connectivity of core 230 and/or predicted core 235. Connectivity of a core means the connections between that core and other circuit elements including other cores. Connectivity, for example, specifies other circuitry, e.g., signals, ports, and/or pins, to which inputs and outputs of a core (e.g., signals, ports, and/or pins) are connected. In this regard, core 230 may be connected to predicted core 235 or may not be connected to predicted core 235. The connectivity indicates the connections for core 230 or for predicted core 235, or for both core 230 and predicted core 235. The determined connectivity may be provided as predicted connectivity for core 230, for predicted core 235, or for both as implementation option(s).

EDA application 205 may provide options as to whether to implement predicted parameterizations and/or connectivity on a per core basis. In another example, EDA application 205 may automatically implement parameterizations and/or connectivity for core 230, for predicted core 235, or for both. In one aspect, whether EDA application 205 first queries whether to perform a particular operation or performs the operation may be specified in a configuration file that may be adjusted.

In another embodiment, EDA application 205 may store any core patterns used within current circuit design 225 within, or as part of, user core pattern data 245. For example, responsive to predicted core 235 being included in current circuit design 225, EDA application 205 may store the core pattern of (core 230, predicted core 235) as a core pattern for the user within core pattern data. As the user adds other cores to current circuit design 225, EDA application 205 may store the resulting combinations of cores included in current circuit design 225 as further core patterns for the user within user core pattern data 245.

One or more core patterns stored in user core pattern data 245 may be designated as user preferences under certain conditions. For example, responsive to EDA application 205 determining that a particular core pattern of user core pattern data 245 is used more than a minimum threshold number of times within current circuit design 225 and/or user circuit designs 220, EDA application 205 may designate a core pattern as a preference for the user. Responsive to EDA application 205 detecting a portion of a core pattern within a different circuit design being created and/or edited by the user, EDA application 205 may provide predicted cores to the user as options for inclusion in the circuit design where the predicted cores are cores not yet included in the circuit design that are determined from the matching core patterns. For example, responsive to determining that a circuit design has core A and core B, EDA application may determine that the circuit design matches a core pattern designated as a preference for the user that is (core A, core B, core C, core D). In response to determining the match, EDA application 205 may offer core C and core D as predicted cores that may be included in the circuit design.

In accordance with the inventive arrangements described within this disclosure, the user is not tasked with first determining which circuit structures to include in a current circuit design before attempting to use automated design functions. By invoking a function to add circuitry without specifying what circuitry to add, the system may automatically identify candidate circuit structures to include in the current circuit design and offer the candidate circuit structures as implementation options.

FIG. 3 is a flow chart illustrating an example of a method 300 of predictive circuit design. Method 300 may be performed by a system as described within this disclosure with reference to FIGS. 1 and 2. Method 300 may begin in a state where a user is in the process of creating and/or modifying a circuit design referred to as "the current circuit design" using a system as described with reference to FIGS. 1 and 2. The current circuit design may be illustrated in graphical form using one or more graphical blocks. The graphical blocks may represent cores within the circuit design.

In block 305, the system may receive a request to modify the current circuit design. For example, the request may be to add an circuitry to the current circuit design. The request does not specify what circuitry is to be added. in this regard, the request is for adding unspecified circuitry to the current circuit design. For example, the system may receive a request indicating that further circuitry is to be added to the current circuit design but not specify which circuitry.

In block 310, the system may determine a first core within the current circuit design. For example, responsive to the request received in block 305, the system may determine the particular core or cores that are already included in the current circuit design.

In block 315, the system may predict a second core not yet included in the current circuit design as a candidate for inclusion in the current circuit design. The second core may be predicted based upon usage within the example circuit designs. For example, the system may predict the second core according to frequency of use within example circuit designs with, or in combination with, the first core. As discussed, the system further may apply weights to the frequencies of use for the cores based upon whether the cores are included within user circuit designs or reference circuit designs and select the second core according to the scores for the various cores.

While the disclosure discusses making predictions as to circuit structures, parameterizations, and/or connectivity based upon usage, in other arrangements, the system may utilize any of a variety of predictive analytics such as machine-learning techniques to predict likely circuit structure(s), parameterization(s), and/or connectivity as candidates for inclusion within and/or application to, the current circuit design.

In block 320, the system may optionally determine connectivity of the first core or connectivity of the second core or connectivity for both the first core and the second core. The system may determine connectivity based upon usage within the example circuit designs. For example, the system may determine, within example circuit designs that include both the first core and the second core, connections for the first core or connections for the second core or connections for both the first core and the second core. The connections may be from the first core to one or more other portions of circuitry or cores, from the second core to one or more other portions of circuitry or cores, or between the first core and the second core.

In one aspect, the system may determine connectivity according to frequency of use. For example, the system may select the connections for the first core or for the second core or for both the first core and the second core that occur with the greatest frequency within those example circuit designs that include both the first core and the second core. Further, weighting of frequency of use may be performed as previously described with reference to FIG. 2 where weights may be applied (e.g., multiplied) to frequencies of use for connections of the reference circuit designs and connections of the user circuit designs. The weights may be the same or different.

In block 325, the system may optionally determine parameterization for the first core or for the second core or for both the first core and the second core. The system may determine parameterization based upon usage within the example circuit designs. Within this specification, the term "parameterization," as applied to a core, means the assignment of a value to a particular parameter of a core that may take on two or more different values.

In one aspect, the system may determine parameterization according to frequency of use. For example, the system may select parameterizations for the first core or for the second core or for both the first core and the second core that occur with the greatest frequency within those example circuit designs that include both the first core and the second core. Further, weighting of frequency of use may be performed as previously described with reference to FIG. 2 where weights may be applied (e.g., multiplied) to frequencies of use for parameterizations of the reference circuit designs and parameterizations of the user circuit designs. The weights may be the same or different.

In block 330, the system may output one or more implementation options relating to the second core for the current circuit design. In one embodiment, the system may output the second core as an implementation option. For example, the system may automatically add the second core to the current circuit design. In another example, the system may query the user whether to include the second core within the current circuit design. Responsive to an indication that the second core should be included in the circuit design, the system may then automatically add the second core to the current circuit design. In illustration, the system may display a graphical block representing the second core within the graphical design environment for the current circuit design.

In another embodiment, the system may output the predicted connectivity and/or the predicted parameterization(s) for the first core or for the second core or for both the first core and the second core as one or more implementation options. For example, the system may automatically apply the predicted parameterization(s) and/or automatically implement the predicted connectivity within the current circuit design. In another example, the system may query the user whether to apply the parameterization(s) and/or to implement the connectivity within the current circuit design. In that case, responsive to an indication to apply the parameterization(s) and/or to implement the connectivity, the system may automatically apply the parameterization(s) and/or implement the connections specified by the connectivity.

In applying a parameterization, the appearance of the graphical block(s) representing the first core and/or the second core as displayed by the system for the current circuit design may be altered to represent the changes in configuration. Further, in implementing the connectivity, the system may draw lines representing wires or other connections implemented within the current circuit design.

It should be appreciated that the system may output the second core, predicted parameterization(s), and/or predicted connectivity independently as different options, together as an implementation option, or in various combinations. As an illustrative example, having predicted the second core, the system may provide an implementation option specifying a parameterization for the first core that is dependent upon the second core being included in the current circuit design. Responsive to an acceptance of the proposed implementation option, i.e., the configuration option of the first core, the system may automatically add the second core to the current circuit design and automatically apply a predicted parameterization and/or connection(s) specified by a predicted connectivity or that may be necessary to support the predicted parameterization.

FIG. 4 is a flow chart illustrating an example implementation of block 315 of FIG. 3. In block 405, the system may determine a subset of the example circuit designs that include the first core. The subset likely includes fewer than the total number of example circuit designs. In block 410, the system may determine other cores within the subset of example circuit designs that include the first core.

In block 415, the system may determine a score for the other cores within the subset of example circuit designs. As noted, the score may be the frequency of use for the other cores within the subset of example circuit designs. The frequency of use may be determined on a per core basis. For example, the frequency of use may be the number of example circuit designs that include a particular one of the other cores. The scores may be weighted as described. In block 420, system may select the core with the highest score as the second core, e.g., as the predicted core.

Figure 5:
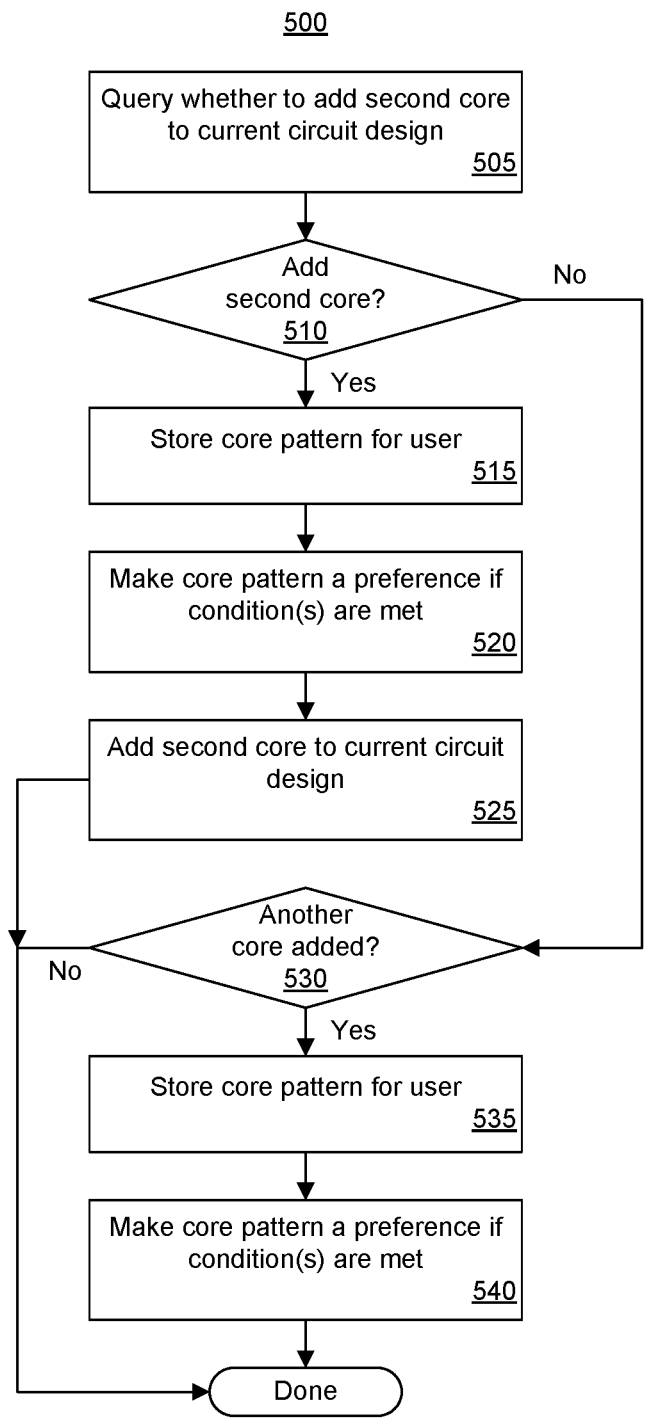
FIG. 5 is a flow chart illustrating an example method of user preference generation.

FIG. 5 is a flow chart illustrating an example method 500 of user preference generation. In one aspect, method 500 may be performed as part of block 330 of FIG. 3. Method 500 illustrates different operations that may be performed to create and maintain user preferences for particular core patterns. In this regard, method 500 does not specifically address parameterizations and/or connectivity. It should be appreciated, however, that connectivity of cores and parameterizations of cores may be stored as part of a user core pattern rather than just storing which core patterns are used.

In block 505, the system may query whether to add the second core to the current circuit design. As noted, the second core is the predicted core selected as the candidate for inclusion in the current circuit design. In block 510, the system determines whether to add the second core to the current circuit design based upon a received response. If the core is to be added, the method may continue to block 515. In block 515, the system creates and stores the core pattern specifying the first core, second core pair for the user.

In block 520, the system may make the core pattern a preference for the user if one or more predetermined conditions are met. In one aspect, the system may determine the number of times that the core pattern is detected within circuit designs of the user, e.g., the user circuit designs. Responsive to detecting the core pattern within the circuit designs of the user more than a minimum number of times, the system designates the core pattern to be a preference for the user and stores the core pattern as a user preference. As a preference, the system may use the core pattern for predicting cores for use in future circuit designs for the user. For example, as the system makes core patterns into preferences, the system may search preferences of the user before evaluating example circuit designs. In block 525, the system may add the second core to the current circuit design. After block 525, the method may end.

In the case where the received response indicates that the second core is not to be included in the circuit design, the method may continue to block 530. In block 530, the system determines whether the user adds a different core to the current circuit design. For example, in the case where the user indicates that the second core is not to be included and the user chooses a different core in place of the second core, the method may continue to block 535. If the user does not choose another core, the method may end.

Continuing with block 535, the system may store the core pattern of the first core and the user selected core (not the predicted core). In block 540, the system may make the core pattern a user preference if one or more predetermined conditions are met. The system may make the core pattern a preference responsive to the core pattern meeting the same or similar conditions as described with reference to block 520.

FIGS. 6-11 are diagrams illustrating example operations performed by a system for predictive circuit design. FIGS. 6-11 show examples of the graphical design environment generated and displayed by a system as described herein. Within the graphical design environment, graphical blocks representing cores or other circuit structure for a current circuit design are illustrated.

Figure 6:
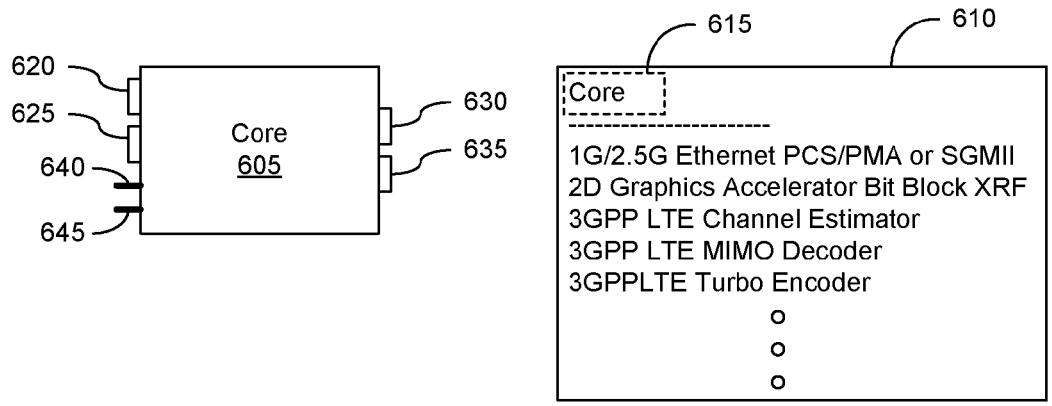

Referring to FIG. 6, the system displays a core 605 as a graphical block within the graphical design environment for the current circuit design. As pictured, core 605 includes ports 620, 625, 630, and 635. In general, a port is a plurality of related pins or terminals of a portion of circuitry such as a core. Core 605 further includes pins 640 and 645.

In the example of FIG. 6, a request to add circuitry, e.g., a core, to the current circuit design is detected. In response, the system displays a window 610. Window 610 includes a list of available cores, e.g., from a core library, that may be included in the current circuit design. Further, in response to the request, the system may determine a predicted core as described herein.

FIG. 6 illustrates that core 615, which has been predicted by the system as a core likely to be included with core 605, is displayed at the top of the list of available cores as a selectable option. Further, core 615 is visually separated or distinguished from the other available cores in the list within window 610.

In another example, window 610 may include a text field that is configured to receive text for searching. The system may receive one or more user input specifying particular characters for the name of a core. In that case, the system may display within window 610 those cores predicted as candidates that also have characters matching the characters entered into the text field. For example, the list of cores presented in window 610 may be filtered so that only those cores that have been predicted and that have characters in the name of the core that match characters entered into the text field are displayed.

Figure 7:
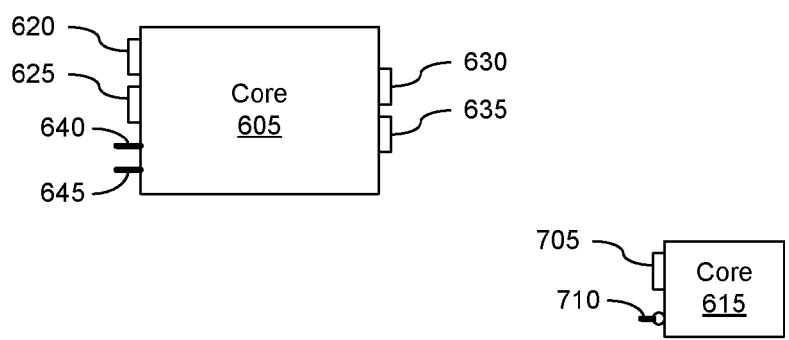

Referring to FIG. 7, responsive to a user input selecting core 615, the system has added core 615, i.e., a graphical block representing core 615, to the current circuit design. Core 615 includes a port 705 and a pin 710. For example, port 705 and pin 710 may be part of a standard parameterization for core 615.

Figure 8:
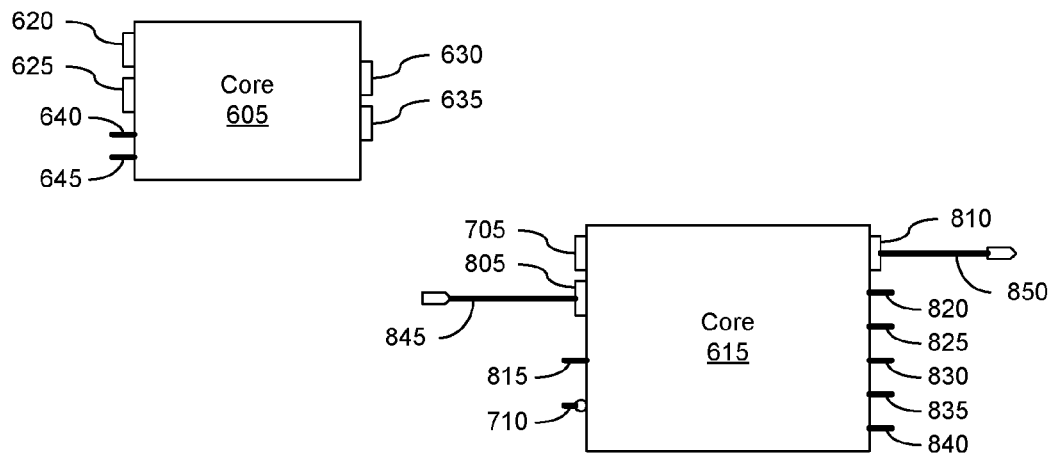

FIG. 8 illustrates an example where the system has determined a predicted parameterization for core 615. The system has applied the predicted parameterization to core 615 and changes the appearance of core 615 to accurately reflect the applied parameterization. The parameterization, which is the assignment of particular values to one or more parameters of a core, results in the exposure of one or more additional signals, pins, and/or ports of the core for use within the current circuit design. As shown, core 615 includes a greater number of elements from applying the parameterization. In addition to port 705 and pin 710, core 615 includes ports 805 and 810. Further core 615 now includes pins 815, 820, 825, 830, 835, and 840. As part of the parameterization, the system has created a connection (specified wire(s)) 845 for port 805 and connection 850 for port 810.

Figure 9:
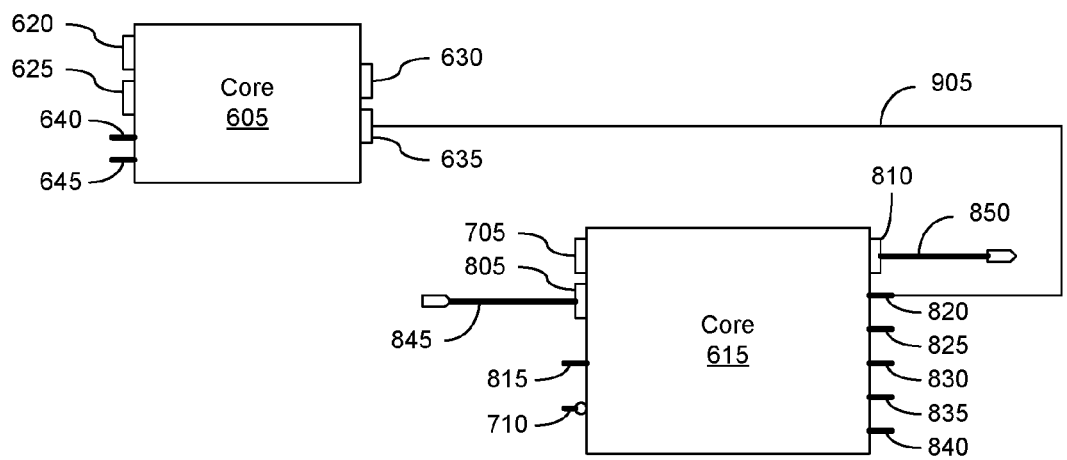

Referring to FIG. 9, the system has determined connectivity for core 615. In the example of FIG. 9, the system has coupled pin 820 with port 635 of core 605 with connection 905. For purposes of illustration, consider an example where core 605 is a MicroBlaze core and core 615 is Memory Interface Generator (MIG) core. The MicroBlaze core accesses memory using the MIG core. In that case, a possible parameterization of core 605 and core 615 is for core 605 to use a clock provided by core 615 to drive a memory mapped interface such as an AXI memory-mapped interface. AXI memory mapped interfaces are based upon one of the AMBA® AXI specifications from ARM, Ltd. of Cambridge, United Kingdom.

Figure 10:
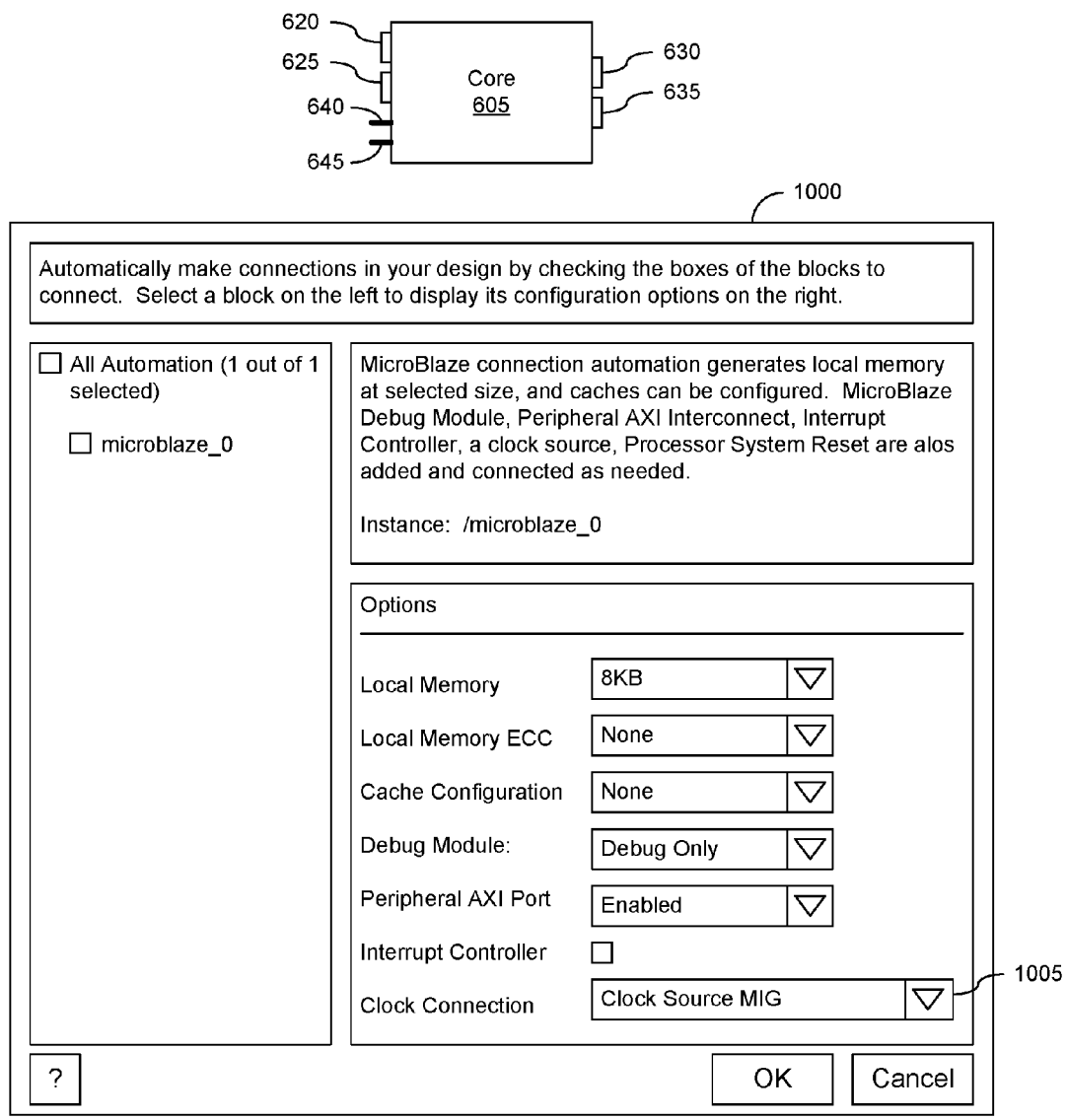

FIG. 10 illustrates an example where the current circuit design includes core 605. In the example of FIG. 10, no other core has been added to the current circuit design. Responsive to a received request, the system displays window 1000. Window 1000 includes a variety of configuration options for core 605. For purposes of discussion, core 605 may be a MicroBlaze core. Using window 1000, a parameterization for core 605 may be specified. Values may be assigned to parameters such as "Local Memory," "Local Memory ECC," "Cache Configuration," "Debug Module," "Peripheral AXI Port," "Interrupt Controller," and "Clock Connection."

As discussed, in some cases, the system may provide implementation options for the current circuit design without first including a predicted core. For example, in the case of the MicroBlaze core being included in the current circuit design where the system predicts the MIG core, the system may provide an implementation option to configure the MicroBlaze core with an implementation option that is dependent upon the MIG core being within the current circuit design despite the MIG core not yet having been added to the current circuit design.

In the case of the "Clock Connection" parameter, for example, the system has automatically a predicted value (e.g., a parameterization). The predicted parameterization displayed in drop down box 1005 uses an implementation option for core 605 that is only available from the MIG core. The value of the parameter is at least initially set to a predicted value of "Clock Source MIG," which sets the clock connection for core 605 to a pin of the MIG core even through the MIG core has not yet been added to the current circuit design. The system has predicted that the MIG core is a candidate for inclusion in the current circuit design given the usage of core 605. In the example of FIG. 10, without first including the MIG core within the current circuit design, the system has provided the MIG core as a clock source option for "Clock Connection" of core 605.

In this example, selecting the "Clock Source MIG" value for the Clock Connection parameter and selecting "OK" in window 1000 causes the system to include core 615 (MIG core) within the current circuit design and connect pin 820 to port 635 using signal 905 as illustrated in FIG. 9. The example of FIG. 10 illustrates a case where a particular parameterization that is provided as an implementation option causes a core to be added automatically, a particular parameterization to be applied to cores 605 and 615 automatically, and a connection to be created automatically between core 605 and core 615.

In conventional EDA tools, a core is first added to a current circuit design before any parameterizations relating to, or dependent upon, that core are usable or even visible as implementation options within the EDA tool. For example, in a conventional EDA tool, the option to use "Clock Source MIG" for Clock Connection of core 605 is not permitted and not made available without the MIG core first being included in the current circuit design. Only after the MIG core is added to the current circuit design and the user chooses to configure core 605 would the "Clock Source MIG" parameterization be available. Thus, within conventional EDA tools, the user must know the particular cores to be added in order to be offered particular implementation options.

FIG. 11 illustrates an example of a window 1100 having a console and a command line. In one arrangement, a graphical design environment may be positioned above window 1100 showing graphical blocks implemented for the current circuit design. The graphical blocks shown may be manipulated using a drag and drop type of interface. The graphical blocks may also be manipulated using the command line of window 1100. Executed commands, status messages, and system responses may be displayed in the console as shown for lines 1102, 1104, 1106, 1108, 1110, 1112, 1114, 1116, and 1118.

The console shows that for the current project called "design_1," at line 1108, a MicroBlaze core has been added by line 1116. As discussed, the system may predict a particular core to be added to the current circuit design. A portion of a command has been typed into the command line. The particular command that is partially entered is one that, when executed, adds a core to the current circuit design. The particular core is not yet specified. Within area 1120, the system may automatically predict a core to be added to the current circuit design. Given that the command is partially entered in the command line, the system may automatically complete the name of the predicted core in the command line in area 1120. Upon execution of the command, a graphical block representing the predicted core is added to the current circuit design and shown in the graphical design environment.

The system may perform further operations on the current circuit design. The system, for example, may convert the graphical block representation of the circuit design into a behavioral description of the current circuit design. The system further may process the behavioral description of the current circuit design through a design flow for implementation within an IC such as a programmable IC or an application specific integrated circuit (ASIC). A design flow includes multiple, different phases. These phases generally include synthesis, placement, and routing.

Synthesis refers to the process of converting, or translating, an abstract, programmatic description of a circuit into a low-level design implementation. The abstract, programmatic description of the circuit describes behavior of the circuit and is also referred to as a "behavioral description" or a "register transfer level (RTL) description" of the circuit. The behavioral description is often specified using a hardware description language (HDL). The low-level design implementation generated through synthesis typically is specified as inter-connected logic gates.

Synthesis may also include mapping. Mapping is the process of correlating, or matching, the logic gates of the low-level circuit design to the various types of physical circuit blocks that are actually available in the particular IC in which the circuit design is to be implemented, i.e., the "target IC." For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned. Routing is the process of selecting particular routing resources such as wires, PIPs, PIP settings, and/or other interconnect circuitry to electrically couple the various circuit blocks of the target IC after placement.

Subsequent to the design flow, the current circuit design is placed and routed. The system may also generate a configuration bitstream from the placed and routed circuit design. The configuration bitstream may be loaded into a programmable IC to implement the current circuit design within the programmable IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" or "HDL" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment. The term "arrangement" and "embodiment" may be used interchangeably.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative embodiments, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method includes, responsive to a request to modify a current circuit design, determining, using a processor, a first core used in the current circuit design and predicting, using the processor, a second core not yet included in the current circuit design as a candidate core for inclusion in the current circuit design based upon usage of the second core and the first core, in combination, in a plurality of example circuit designs.

The method may include adding the second core to the current circuit design. The method may also include creating a core pattern specifying the first core and the second core and storing the core pattern in a memory in association with a user for use in making a subsequent prediction of a candidate core for inclusion in a further circuit design of the user.

In one arrangement, responsive to the predicting the second core, the method includes providing a parameterization option for the first core that is dependent upon the second core.

The method may include determining, based upon the usage, a connection between the first core and the second core for use in the current circuit design from a plurality of different connections between the first core and the second core within the example circuit designs.

The method may include determining, based upon the usage, a parameterization of the first core for use in the current circuit design from a plurality of different parameterizations of the first core within the example circuit designs including both the first core and the second core.

The method may include determining, based upon the usage, a parameterization of the second core for use in the current circuit design from a plurality of different parameterizations of the second core within the example circuit designs including both the first core and the second core.

A system includes a processor configured to initiate executable operations. The executable operations include, responsive to a request to modify a current circuit design, determining a first core used in the current circuit design and predicting a second core not yet included in the current circuit design as a candidate core for inclusion in the current circuit design based upon usage of the second core and the first core, in combination, in a plurality of example circuit designs.

The processor may be configured to initiate executable operations further including adding the second core to the current circuit design. The processor may be configured to initiate executable operations further including creating a core pattern specifying the first core and the second core and storing the core pattern in a memory in association with a user for use in making a subsequent prediction of a candidate core for inclusion in a further circuit design of the user.

In one arrangement, the processor may be configured to initiate executable operations further including, responsive to the predicting the second core, providing a parameterization option for the first core that is dependent upon the second core.

The processor may be configured to initiate executable operations further including determining, based upon the usage, a connection between the first core and the second core for use in the current circuit design from a plurality of different connections between the first core and the second core within the example circuit designs.

The processor may be configured to initiate executable operations further including determining, based upon the usage, a parameterization of the first core for use in the current circuit design from a plurality of different parameterizations of the first core within the example circuit designs including both the first core and the second core.

The processor may also be configured to initiate executable operations further including, determining, based upon the usage, a parameterization of the second core for use in the current circuit design from a plurality of different parameterizations of the second core within the example circuit designs including both the first core and the second core.

A computer program product includes a computer readable storage medium having program code stored thereon. The program code is executable by a processor to perform operations. The operations include, responsive to a request to modify a current circuit design, determining, using the processor, a first core used in the current circuit design and predicting, using the processor, a second core not yet included in the current circuit design as a candidate core for inclusion in the current circuit design based upon usage of the second core and the first core, in combination, in a plurality of example circuit designs.

In another arrangement, the program code is executable by the processor to perform operations further including adding the second core to the current circuit design. The program code is executable by the processor to perform operations further including creating a core pattern specifying the first core and the second core and storing the core pattern in a memory in association with a user for use in making a subsequent prediction of a candidate core for inclusion in a further circuit design of the user.

The program code is also executable by the processor to perform operations further including, responsive to the predicting the second core, providing a parameterization option for the first core that is dependent upon the second core.

The program code is executable by the processor to perform operations further including determining, based upon the usage, a connection between the first core and the second core for use in the current circuit design from a plurality of different connections between the first core and the second core within the example circuit designs.

The program code is executable by the processor to perform operations further including determining, based upon the usage, a parameterization of the first core or for the second core for use in the current circuit design from a plurality of different parameterizations of the first core or of the second core within the example circuit designs including both the first core and the second core.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   responsive to a request to modify a current circuit design, determining, using a processor, a first core used in the current circuit design; and
   predicting, using the processor, a second core not yet included in the current circuit design as a candidate core for inclusion in the current circuit design based upon usage of the second core and the first core, in combination, in a plurality of example circuit designs.

2. The method of claim 1, further comprising:
   adding the second core to the current circuit design.

3. The method of claim 2, further comprising:
   creating a core pattern specifying the first core and the second core and storing the core pattern in a memory in association with a user for use in making a subsequent prediction of a candidate core for inclusion in a further circuit design of the user.

4. The method of claim 1, further comprising:
   responsive to the predicting the second core, providing a parameterization option for the first core that is dependent upon the second core.

5. The method of claim 1, further comprising:
   determining, based upon the usage, a connection between the first core and the second core for use in the current circuit design from a plurality of different connections between the first core and the second core within the example circuit designs.

6. The method of claim 1, further comprising:
   determining, based upon the usage, a parameterization of the first core for use in the current circuit design from a plurality of different parameterizations of the first core within the example circuit designs including both the first core and the second core.

7. The method of claim 1, further comprising:
   determining, based upon the usage, a parameterization of the second core for use in the current circuit design from a plurality of different parameterizations of the second core within the example circuit designs including both the first core and the second core.

8. A system, comprising:
   a processor configured to initiate executable operations including:
   responsive to a request to modify a current circuit design, determining a first core used in the current circuit design; and
   predicting a second core not yet included in the current circuit design as a candidate core for inclusion in the current circuit design based upon usage of the second core and the first core, in combination, in a plurality of example circuit designs.

9. The system of claim 8, wherein the processor is configured to initiate executable operations further comprising:
   adding the second core to the current circuit design.

10. The system of claim 9, wherein the processor is configured to initiate executable operations further comprising:
    creating a core pattern specifying the first core and the second core and storing the core pattern in a memory in association with a user for use in making a subsequent prediction of a candidate core for inclusion in a further circuit design of the user.

11. The system of claim 8, wherein the processor is configured to initiate executable operations further comprising:
    responsive to the predicting the second core, providing a parameterization option for the first core that is dependent upon the second core.

12. The system of claim 11, wherein the processor is configured to initiate executable operations further comprising:
    determining, based upon the usage, a connection between the first core and the second core for use in the current circuit design from a plurality of different connections between the first core and the second core within the example circuit designs.

13. The system of claim 8, wherein the processor is configured to initiate executable operations further comprising:
    determining, based upon the usage, a parameterization of the first core for use in the current circuit design from a plurality of different parameterizations of the first core within the example circuit designs including both the first core and the second core.

14. The system of claim 8, wherein the processor is configured to initiate executable operations further comprising:
    determining, based upon the usage, a parameterization of the second core for use in the current circuit design from a plurality of different parameterizations of the second core within the example circuit designs including both the first core and the second core.

15. A computer program product comprising a non-transitory computer readable storage medium having program code stored thereon, the program code executable by a processor to perform operations comprising:
  responsive to a request to modify a current circuit design, determining, using the processor, a first core used in the current circuit design; and
  predicting, using the processor, a second core not yet included in the current circuit design as a candidate core for inclusion in the current circuit design based upon usage of the second core and the first core, in combination, in a plurality of example circuit designs.

16. The computer program product of claim 15, wherein the program code is executable by the processor to perform operations further comprising:
  adding the second core to the current circuit design.

17. The computer program product of claim 16, wherein the program code is executable by the processor to perform operations further comprising:
  creating a core pattern specifying the first core and the second core and storing the core pattern in a memory in association with a user for use in making a subsequent prediction of a candidate core for inclusion in a further circuit design of the user.

18. The computer program product of claim 15, wherein the program code is executable by the processor to perform operations further comprising:
  responsive to the predicting the second core, providing a parameterization option for the first core that is dependent upon the second core.

19. The computer program product of claim 15, wherein the program code is executable by the processor to perform operations further comprising:
  determining, based upon the usage, a connection between the first core and the second core for use in the current circuit design from a plurality of different connections between the first core and the second core within the example circuit designs.

20. The computer program product of claim 15, wherein the program code is executable by the processor to perform operations further comprising:
  determining, based upon the usage, a parameterization of the first core or the second core for use in the current circuit design from a plurality of different parameterizations of the first core or of the second core within the example circuit designs including both the first core and the second core.

* * * * *